| (12) | United States Patent | (10) Patent No.: | US 7,638,003 B2 |
|---|---|---|---|
| | Satoh et al. | (45) Date of Patent: | Dec. 29, 2009 |

(54) SEMICONDUCTOR PROCESSING APPARATUS WITH LIFT PIN STRUCTURE

(75) Inventors: Kiyoshi Satoh, Tama (JP); Takayuki Yamagishi, Tama (JP)

(73) Assignee: ASM Japan K.K., Tokyo (JP)

( * ) Notice: Subject to any disclaimer, the term of this patent is extended or adjusted under 35 U.S.C. 154(b) by 704 days.

(21) Appl. No.: 11/330,662

(22) Filed: Jan. 12, 2006

(65) Prior Publication Data

US 2007/0160507 A1  Jul. 12, 2007

(51) Int. Cl.
  C23C 16/00  (2006.01)
  C23F 1/00  (2006.01)
  H01L 21/306  (2006.01)

(52) U.S. Cl. .................................. 118/728; 156/345.51

(58) Field of Classification Search ............... 118/715, 118/724, 725, 728; 156/345.51, 345.52, 156/345.53
See application file for complete search history.

(56) References Cited

U.S. PATENT DOCUMENTS 4,790,258 A * 12/1988 Drage et al. ................. 118/500
5,421,893 A    6/1995 Perlov
5,562,947 A *  10/1996 White et al. ................ 427/255.5
6,190,113 B1   2/2001 Bui et al.
6,435,798 B1 * 8/2002 Satoh ........................ 414/217
6,955,741 B2  10/2005 Yamagishi
7,422,655 B2 * 9/2008 Asakura .................. 156/345.51
2004/0045509 A1 * 3/2004 Or et al. ..................... 118/729

FOREIGN PATENT DOCUMENTS

JP      2005-150725 A    6/2005
WO     WO 2004095568 A1 * 11/2004

* cited by examiner

Primary Examiner—Parviz Hassanzadeh
Assistant Examiner—Tiffany Nuckols
(74) Attorney, Agent, or Firm—Knobbe Martens Olson & Bear LLP

(57) ABSTRACT

A semiconductor processing apparatus includes: a reaction chamber; a susceptor disposed in the reaction chamber for placing a substrate thereon and having through-holes in an axial direction of the susceptor; lift pins slidably disposed in the respective through-holes for lifting the substrate over the susceptor; and a means for reducing contact resistance between the lift pins and the respective through-holes.

20 Claims, 6 Drawing Sheets

SEMICONDUCTOR PROCESSING APPARATUS WITH LIFT PIN STRUCTURE

BACKGROUND OF THE INVENTION

1. Field of the Invention

The present invention relates to a semiconductor processing apparatus processing single or plural semiconductor substrates at a time; particularly to a mechanism supporting a semiconductor substrate inside a reaction chamber.

2. Description of the Related Art

In a semiconductor device processing process of today, a processing apparatus, which processes a semiconductor wafer by the piece, predominates. Generally in a single-wafer-processing apparatus, a susceptor is disposed inside a reaction chamber which can be kept airtight, and processing is performed to a semiconductor wafer being placed on the susceptor while the wafer is heated at a given temperature.

A typical susceptor in a single-wafer-processing apparatus is comprised of a disk made of a metal having high thermal conductivity or ceramics and has a heating element such as an electric heater built in. This type of susceptor has at least three through-holes, and substrate lift pins are inserted in the respective through-holes. When a semiconductor wafer is transferred into a reaction chamber by an external transfer system, the substrate lift pins move upward and protrude from the through-holes to receive the semiconductor wafer; subsequently, they move downward to place the semiconductor wafer on the susceptor. Additionally, when a processed semiconductor wafer is transferred from inside the reaction chamber to the outside, the substrate lift pins move upward again and protrude from the through-holes to support the semiconductor wafer and the semiconductor wafer is transferred to outside the reaction chamber by the transfer system.

In order to receive and deliver a semiconductor wafer on a susceptor, several different methods of sending a substrate lift pin up to protrude it from an upper surface of a susceptor are used.

The simplest method is to attach a lower end of the substrate life pin on a bottom portion of a reaction chamber to move the susceptor up and down.

It is designed that a substrate lift pin protrudes from an upper surface of a susceptor as the susceptor comes down.

In a different method, a lower end of a substrate lift pin is not attached and is moved up and down by a movable plate engaged with a lower end of the substrate lift pin; further, a susceptor can be moved up and down simultaneously with the lift pin. In this method, the lift pin has a structure of being suspended from the susceptor.

With these methods, methods with several improvements/modifications made have also been presented, in which functions are upgraded.

These substrate-supporting mechanisms are described in U.S. Pat. Nos. 5,421,893, 6,190,113, 6,995,741, 6,435,798, Japanese Patent Laid-open No. 2005-150725, etc.

SUMMARY OF THE INVENTION

Although these conventional techniques attempt to resolve each other's problem, they have problems described below.

First, a method in which a substrate lift pin is attached on a bottom portion of a reaction chamber has a problem which an inner wall of a through-hole in a susceptor and a substrate lift pin interfere with each other. For example, in a plasma CVD apparatus, a susceptor is heated at 300° C. to 400° C., whereas the bottom portion of the reaction chamber is heated at about 100° C. to 200° C. which is a relatively low temperature. This temperature difference causes a difference in a heat expansion amount, thereby causing position misalignment of a through-hole in a susceptor with a substrate lift pin. Because of this positional misalignment and up-and-down movement of the susceptor, the substrate lift pin comes in contact with an inner wall of the through-hole in the susceptor, thereby causing a foreign matter.

This foreign matter is carried to an upper surface of the susceptor and contaminates the underside of a semiconductor wafer to be processed. Additionally, because the substrate lift pin is attached on the bottom portion of the reaction chamber, in the event of replacing a substrate lift pin, the susceptor needs to be removed. In order to remove the susceptor, it requires cooling down the susceptor heated at a high temperature to a safe temperature (e.g., 50° C. or lower) and after the substrate lift pin is replaced, it is necessary to heat the susceptor up to a given operating temperature (e.g. 400° C.). It takes approximately 3 to 4 hours respectively for the cooling and the heating, which leads to long down time of the apparatus.

Secondly, in a method in which a lower end of a substrate lift pin is not attached, because the substrate lift pin is suspended from a susceptor, there is no such problem as positional misalignment of a through-hole in a susceptor with the substrate lift pin as described above. A phenomenon, however, that the substrate lift pin is caught in the through-hole in the susceptor, occurs. For example, in the case of a CVD apparatus, a process of giving seasoning layer coating to the inside of a reaction chamber is performed before a semiconductor wafer is carried into the reaction chamber. Because this process, which is called 'seasoning' or 'precoating', is performed without a semiconductor wafer, adhesion of a formed seasoning layer to an inner surface of a through-hole as well as to an upper surface of the susceptor occurs. Because of this adhesion of the formed seasoning layer to the inside of the through-hole, a problem that a substrate lift pin inserted therein is stuck therein is caused. As a result, the substrate lift pin cannot be moved inside the through-hole.

With its lower end being lifted by a movable plate, a substrate lift pin protrudes from an upper surface of a susceptor. Even if the movable plate comes down, the substrate lift pin does not come down along with the plate from its position in which it protrudes from the upper surface of the susceptor because it is stuck in the through-hole in the susceptor, or the formed seasoning layer or a reaction product has got in a gap between the lift pin and the through-hole. In order to prevent this, the substrate lift pin needs to be attached to the movable plate. If attached, the second mechanism becomes identical to that in the first method, and causes a problem of positional misalignment with the through-hole in the susceptor.

Consequently, in an embodiment, the present invention relates to a mechanism supporting a semiconductor wafer inside a reaction chamber and has an objective to provide a substrate supporting mechanism which does not cause positional misalignment of a substrate lift pin with a through-hole in a susceptor.

Additionally, in an embodiment, the present invention has an objective to provide a substrate supporting mechanism in which a substrate lift pin does not cause interference with a through-hole in a susceptor.

Additionally, in an embodiment, the present invention has an objective to provide a substrate supporting mechanism which does cause malfunctions such as a substrate lift pin being stuck in or caught in a through-hole in a susceptor.

Furthermore, in an embodiment, the present invention has an objective to provide a semiconductor processing apparatus having an improved operating rate by reducing maintenance time by facilitating mounting/removing a substrate lift pin.

In an embodiment, the present invention which can achieve one or more of the above objectives provides a semiconductor processing apparatus comprising: (i) a reaction chamber; (ii) a susceptor disposed in the reaction chamber for placing a substrate thereon, said susceptor having through-holes in an axial direction of the susceptor; (iii) lift pins slidably disposed in the respective through-holes for lifting the substrate over the susceptor; and (iv) a means for reducing contact resistance between the lift pins and the respective through-holes.

The above embodiment includes, but is not limited to, the following embodiments:

The semiconductor processing apparatus may further comprise a drive which moves the susceptor in its axial direction.

The lift pins may have lower ends which are attached to a bottom portion of the reaction chamber, and the means for reducing contact resistance may comprise multiple pairs of magnetic materials, each pair being magnetically attracted to each other wherein one of the pair is provided at the lower end of each lift pin, and the other of the pair is provided at the bottom portion of the reaction chamber.

The susceptor may further comprise ceramic hollow columns inserted therein which form the respective through-holes. Each ceramic hollow column may have an inner portion having an inside diameter which is smaller, especially at upper and lower ends, than that of the remaining inner portion which is not in contact with the lift pins.

The means for reducing contact resistance may comprise inner surfaces of the through-holes having a surface roughness of 0.8 µm or less.

The lift pins may have free lower ends and are suspended in the through-holes by supporting upper ends of the lift pins at an upper surface of the susceptor.

The semiconductor processing apparatus may be a plasma CVD/etching apparatus.

In another embodiment, the present invention which can achieve one or more of the above objectives provides a semiconductor processing apparatus comprising: (i) a reaction chamber; (ii) a susceptor disposed in the reaction chamber for placing a substrate thereon, said susceptor having through-holes in an axial direction of the susceptor; (iii) lift pins slidably disposed in the respective through-holes for lifting the substrate over the susceptor, said lift pins having lower ends which are attached to a bottom portion of the reaction chamber; and (iv) multiple pairs of magnetic materials, each pair being magnetically attracted to each other wherein one of the pair is provided at the lower end of each lift pin, and the other of the pair is provided at the bottom portion of the reaction chamber.

The above embodiment includes, but is not limited to, the following embodiments:

The other of the pair may contain a magnet covered with a ceramic material or fluorine plastic (such as tetrafluoroethylene, fluorinated ethylene propylene). The one of the pair may contain a magnetic material embedded in the lower end of the lift pin. The bottom portion of the reaction chamber may be provided with a bottom plate made of ceramics on which the other of the pair is affixed.

The semiconductor processing apparatus may further comprise a drive which moves the susceptor in its axial direction.

The susceptor may further comprise ceramic hollow columns inserted therein which form the respective through-holes. Each ceramic hollow column may have an inner portion having an inside diameter which is smaller than that of the remaining inner portion which is not in contact with the lift pins. The inner portion may have an inner surface having a surface roughness of 0.8 µm or less. The susceptor may be comprised of a susceptor plate and a susceptor heater, and an upper end of each ceramic hollow column has a flange which is affixed between the susceptor plate and the susceptor heater.

In still another embodiment, the present invention which can achieve one or more of the above objectives provides a semiconductor processing apparatus comprising: (i) a reaction chamber; (ii) a susceptor disposed in the reaction chamber for placing a substrate thereon, said susceptor comprises ceramic hollow columns inserted therein which form respective through-holes; and (iii) lift pins slidably disposed in the respective through-holes for lifting the substrate over the susceptor.

The above embodiment includes, but is not limited to, the following embodiments:

Each ceramic hollow column may have an inner portion having an inside diameter which is smaller than that of the remaining inner portion which is not in contact with the lift pins. The inner portion may have an inner surface having a surface roughness of 0.8 µm or less. The lift pins may have free lower ends and are suspended in the through-holes by supporting upper ends of the lift pins at an upper surface of the susceptor.

In yet another embodiment, the present invention which can achieve one or more of the above objectives provides a susceptor configured to be disposed in a reaction chamber for placing a substrate thereon, comprising a susceptor body and ceramic hollow columns inserted in the susceptor body, said ceramic hollow columns forming through-holes through which respective lift pins are inserted.

In an additional embodiment, the present invention which can achieve one or more of the above objectives provides a lift pin configured to be slidably disposed in a through-hole of a susceptor for lifting a substrate, wherein the lift pin comprises a magnetic material embedded in a lower end which is to be attached to a bottom portion of a reaction chamber provided with another magnetic material, wherein the magnetic material and the other magnetic material are magnetically attracted to each other.

In all of the aforesaid embodiments, any element used in an embodiment can interchangeably or additionally be used in another embodiment unless such a replacement is not feasible or causes adverse effect. Further, the present invention can equally be applied to apparatuses and methods.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale. For example, there is a gap between a wafer lift pin and a susceptor plate or susceptor heater, although they may look as if they are in contact with each other in some of the drawings.

DETAILED DESCRIPTION OF THE PREFERRED EMBODIMENT

The present invention will be explained with respect to preferred embodiments. However, the preferred embodiments are not intended to limit the present invention.

The present invention is described by referring to figures. Additionally, "the present invention" aims to mean "an embodiment of the present invention", but "an embodiment of the present invention" does not aim to limit the present invention thereby.

Figure 1:
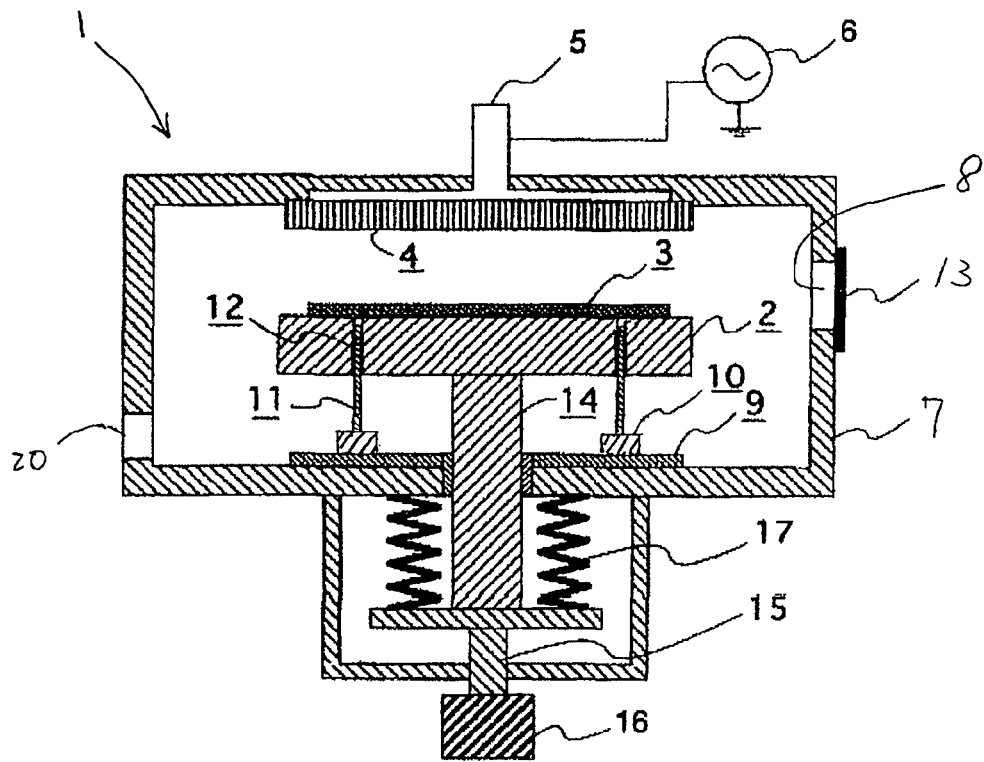
FIG. 1 is a schematic cross sectional view of a semiconductor processing apparatus according to an embodiment of the present invention, wherein a substrate is placed on a top surface of a susceptor.

FIG. 1 is a schematic cross sectional view of a plasma CVD apparatus according to an embodiment of the present invention. The plasma CVD apparatus 1 for forming a thin film on a semiconductor wafer 3 according to the present invention comprises a reaction chamber 7, a susceptor 2 disposed inside the reaction chamber 7 for placing the semiconductor wafer 3 thereon, a showerhead 4 disposed facing the susceptor 2 for jetting out reaction gas uniformly onto the semiconductor wafer 3, an exhaust port 20 for exhausting gas inside the reaction chamber 7, and a RF oscillator 6 for exciting plasma for plasma discharge.

At a side surface of the reaction chamber 7, an opening portion 8 is provided; and the reaction chamber 7 is connected with a transfer chamber (not shown) for carrying in and out a semiconductor wafer via a gate valve 13.

The susceptor 2 disposed inside the reaction chamber 7 for placing a semiconductor wafer 3 thereon is made of anodized aluminum or aluminum alloy and grounded to form one side of electrodes for plasma discharge. Inside the susceptor 2, a disk-shaped heating element (not shown) is embedded and controls a temperature of the semiconductor wafer 3 at a given temperature using a temperature controller (not shown). The susceptor 2 is connected with a drive mechanism 15, 16 for moving the susceptor 2 in its axial direction through a support medium 14.

A material used for the susceptor 2 for placing a semiconductor wafer 3 thereon is not limited to the aforesaid anodized aluminum or aluminum alloy, but a ceramic heater may also be used. The ceramic heater has a ceramic base and a metallic body which forms one side of electrodes for plasma discharge with a resistance heating element embedded therein. The metallic body is grounded to function as an electrode for plasma discharge. The ceramic base is made of a material having excellent corrosion resistance, and thermal conductivity sufficient to function as a heater such as aluminum nitride, magnesium oxide and aluminum oxide. For the resistance heating element, tungsten is used; for the metallic body which is an electrode for plasma discharge, tungsten or molybdenum can be used.

Inside the reaction chamber 7, the showerhead 4 is provided facing the susceptor 2. Thousands of fine pores are provided in the showerhead 4 for jetting out reaction gas onto the semiconductor wafer 3. The showerhead 4 is electrically connected with a RF oscillator 6 and forms the other side of electrodes for plasma discharge. In order to introduce reaction gas used for forming a thin film to the showerhead 4, a reaction gas introduction conduit 5 is provided.

An exhaust port 20 is provided on a side wall of the reaction chamber 7; the exhaust port 20 is connected with a vacuum exhaust pump (not shown) through piping. In the middle of the exhaust port 20 and the vacuum pump, a conductance-regulating valve (not shown) for regulating a pressure inside the reaction chamber 7 is provided and electrically connected with an external regulator (not shown).

Inside a through-hole 12 provided in the susceptor 2, at least three wafer lift pins 11 which can support a semiconductor 3 are provided. Down below the wafer lift pins 11, supporting members 10 supporting respective lower ends of the wafer lift pins 11 are provided. The supporting members 10 are installed on a bottom plate 9 attached at a bottom portion of the reaction chamber 7.

In FIG. 1 showing the susceptor 2 in an elevated position, upper ends of the wafer lift pins 11 are inside the through-holes 2 and the semiconductor wafer 3 is supported by the upper surface of the susceptor 2.

Here, the wafer lift pins 11 are composed of or exterior coated by a material having durability against an atmosphere and a temperature inside the reaction chamber 7 such as aluminum, aluminum alloy, or an anodized coating of the foregoing, or alumina ceramics, aluminum nitride, magnesium oxide, yttria ($Y_2O_3$) or magnesium fluoride. The supporting members 10 are also composed of or exterior coated by a material having durability against an atmosphere and a temperature inside the reaction chamber 7 such as aluminum, aluminum alloy, or an anodized coating of the foregoing, or alumina ceramics, aluminum nitride, magnesium oxide, yttria or magnesium fluoride.

Additionally, the bottom plate 9 can be composed of aluminum or aluminum alloy, or a material having resistance to fluorine active species or oxygen active species such as alumina ceramics and aluminum nitride. Additionally, although the supporting member 10 is installed on the bottom plate 9 in FIG. 1, for example, by providing a concave portion in the bottom plate 9, the supporting member 10 can be fixed by fitting it in the concave portion.

When only a gas which does not contain an oxidative component is used (for example, cases in which a film is formed using $SiH_4$, $N_2$, $NH_3$, and $NF_3$ in order to form a SiN film, and an inert gas, Ar or He, are used as a cleaning gas used for subsequent reaction chamber cleaning and so forth), carbon-containing materials can be used as a material for the supporting member 10 and the wafer lift pins 11, or exterior coating.

Additionally, when a temperature of the susceptor 2 is relatively low (e.g., approximately 200° C. or lower), fluororesin having resistance to the temperature used can be used.

Figure 3:
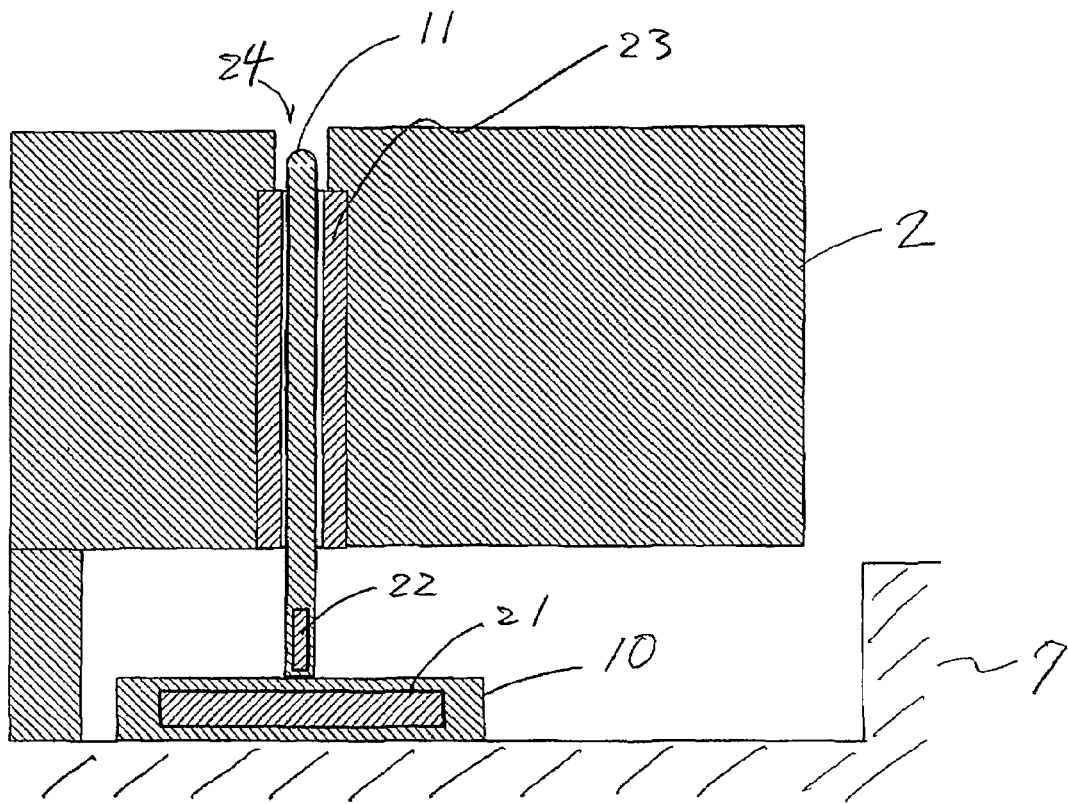
FIG. 3 is an enlarged schematic cross sectional view showing a structure of a lift pin area according to an embodiment of the present invention.

In the supporting member 10, a magnet 21 is embedded so as to be able to attach the wafer lift pin 11, in which a magnetic material is embedded, by magnetic force as shown in FIG. 3 described later. A magnet may also be embedded in the wafer lift pin 11. Additionally, as a magnetic material, any material which can be magnetized may be used, for example, iron oxide, chromium oxide, cobalt or ferrite can be used.

As a magnet to be embedded in the supporting member 10, any magnet may be used as long as its magnetic-flux density is not degraded by an ambient temperature. A magnet which can ensure magnetic-flux density (e.g., approximately 0.3T to approximately 3.0T; preferably approximately 0.8T to approximately 1.5T) sufficient to attach the wafer lift pin 11 at a temperature higher than that of the susceptor 2 can be selected; for example, alnico magnet or samarium magnet can be used.

Additionally, the supporting member may have either of a columnar shape, a quadrangular prism shape or a polyangular prism shape. For example, if a supporting member is columnar, it may have a diameter of approximately 10 mm to approximately 30 mm and a thickness of approximately 5 mm to approximately 30 mm. Additionally, the lift pin has, for example, a diameter of approximately 3 mm to approximately 5 mm, and the diameter is properly adjusted in relation to a shape or of a susceptor, a through-hole size, etc. The magnet or the magnetic material which is embedded in the lift pin may have, for example, a diameter of approximately 2 mm to approximately 4 mm and a length of approximately 5 mm to approximately 30 mm. Additionally, in an embodiment, a diameter of a lift pin stays constant from its lower end to its upper end, and the upper end is rounded (FIG. 3, etc.).

A means for embedding a magnet (or a magnetic material) in a lift pin is not particularly limited, but for example, a method in which a meshed magnetic material is rounded into a size of approximately 2 mm to approximately 4 mm in diameter, and embedded inside a ceramic pin and simultaneously sintered, or a method in which a cavity is made inside a ceramic pin from the bottom, a magnetic material is inserted in the cavity, an opening of the cavity is covered by a lid, and the lid is fixed by a ceramic adhesive or fitting it into the opening can be used.

Figure 2:
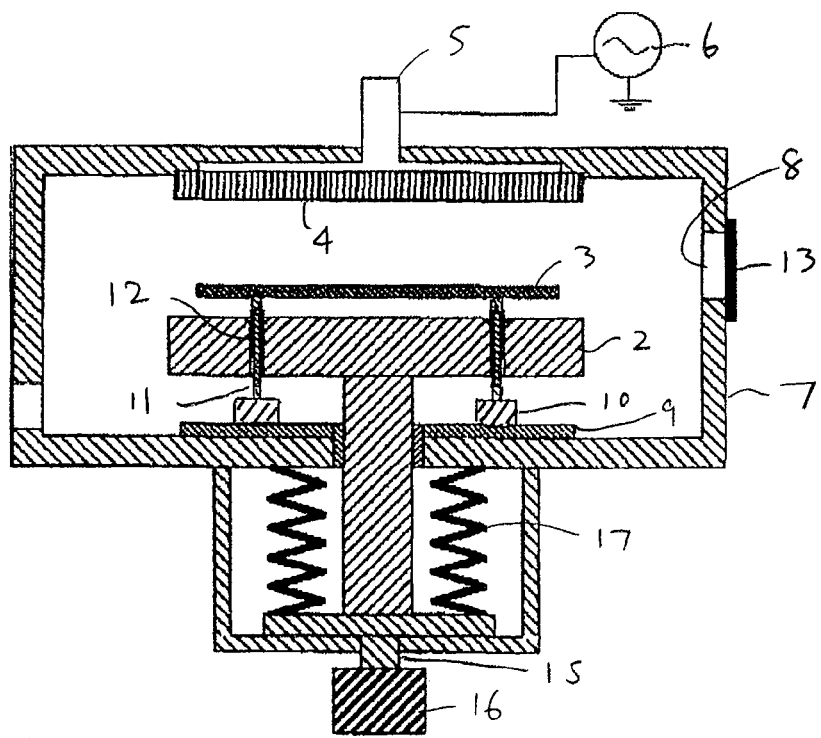
FIG. 2 is a schematic cross sectional view of the semiconductor processing apparatus of FIG. 1, wherein the substrate is lifted over the top surface of the susceptor by lift pins.

FIG. 2 shows positional relation between the susceptor 2 and the lift pin 1 when a semiconductor wafer 3 is transferred into/out of the reaction chamber 7. The susceptor 2 is connected with a drive mechanism 15, 16 for moving the susceptor 2 up and down through a support medium 14. By creating a gap between the semiconductor wafer 2 and the susceptor 2, a blade (not shown) of a transfer robot (not shown) is inserted into the gap. The gap is created by sending the susceptor 2 down by the drive mechanism 16. When the susceptor is lowered, an upper end of the wafer lift pin 11 a lower end of which is attached protrudes from an upper surface of the susceptor 2 and supports the semiconductor wafer 3 from its downside. Bellows 17 are provided down below the susceptor 2 to absorb up-and-down movement of the susceptor.

A structure of the wafer lift pin 11, the susceptor 2 and the supporting member 10 is described in details.

FIG. 3 shows an example of the present invention.

Inside a through-hole 24 of a susceptor 2, a ceramic guide 23 is inserted, and inside the tubular ceramic guide 23, a wafer lift pin 11 is inserted. The guide 23 is made of a material having excellent resistance to heat and plasma such as alumina ceramics, aluminum nitride and magnesium oxide. Inside the wafer lift pin 11 and in the vicinity of its lower end, a magnetic material 22 is embedded. Inside the supporting member 10 installed at a bottom portion of the reaction chamber 7, a magnet 21 is provided and attracts the magnetic material 22 embedded in the wafer lift pin 11. By this adsorption power of the magnet 21 and the magnetic material 22, a lower end of the wafer lift pin 11 is adsorbed on an upper surface of the supporting member 10.

Because this adsorption of the wafer lift pin 11 and the supporting member 10 allows transverse movement of the wafer lift pin 11, a problem of the through-hole 24 coming in contact with the wafer lift pin 11 due to positional change of the through-hole is solved. When a susceptor 2 is installed, the wafer lift pin 11 can always be aligned with the center of the through-hole 24 because of a guide 23 inserted in the susceptor 2 even if the position of the through-hole 24 does not perfectly agree with a design value. Because the lower end of the wafer lift pin 11 is adsorbed on the supporting member 10 by magnetic force, the lower end allows transverse movement without coming off from the upper surface of the supporting member 10.

Additionally, a bottom plate 9 is not used in FIG. 3. The supporting member 10 is installed directly at a bottom portion of a reaction chamber 7. When a structure for receiving a supporting member 10 is not provided at a bottom portion of the reaction chamber, the bottom plate 9 is installed to take over a role of the supporting member 10. When a structure for receiving a supporting member 10 is provided at a bottom portion of a reaction chamber, there is no need to install a bottom plate. Additionally, although a step which is not included in FIG. 1 is included in FIG. 3, it is included because FIG. 1 is a simplified schematic view. In this embodiment, a step is provided at a bottom portion of the reaction chamber. Additionally, this step may also not need to be provided.

Figure 4:
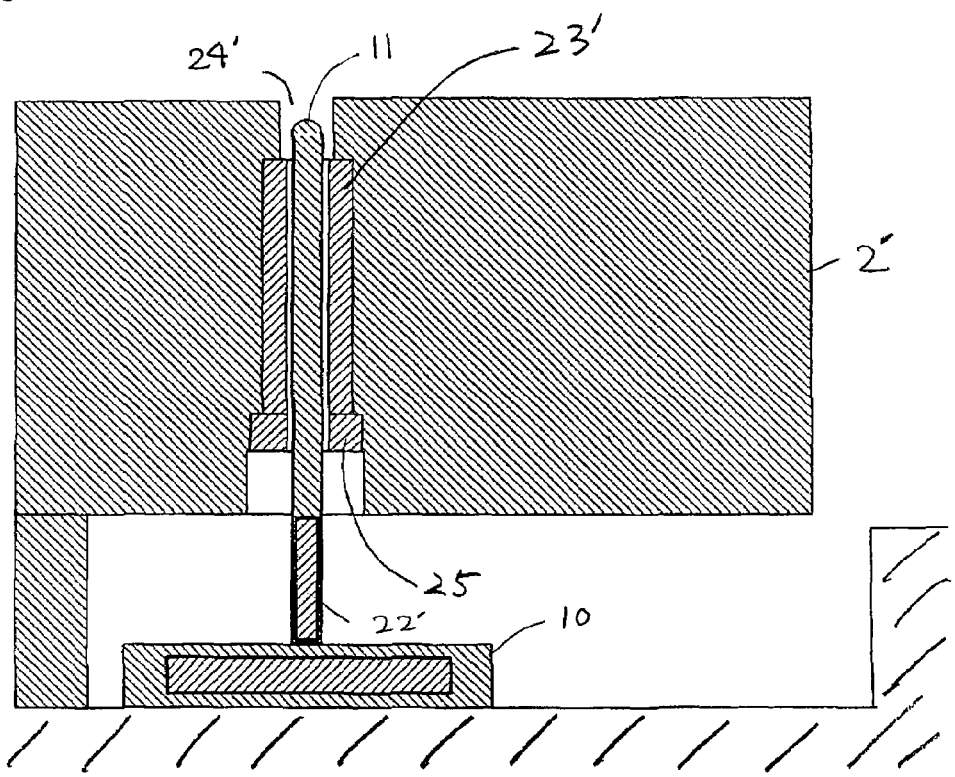
FIG. 4 is an enlarged schematic cross sectional view showing a structure of a lift pin area according to another embodiment of the present invention.

In FIG. 4, an example of securing a ceramic guide 23' in a susceptor 2' is shown.

The guide 23' is secured inside a through-hole 24' in the susceptor 2' using a securing ring 25 attached to its lower side. Additionally, although a magnet 22' inside a lift pin 11 is depicted by magnifying it in this figure, the magnet 22' may also be the same one as the magnet 22. Additionally, when a ceramic lift pin is manufactured, a lift pin shown in FIG. 4, a portion of which is magnetic, can also be manufactured by mixing a magnetic material in the portion of the ceramic lift pin simultaneously with sintering the lift pin, which corresponds to the magnet 22'.

The securing ring 25 may be fixed in a through-hole provided in a susceptor by fitting it in the through-hole, but may also be fixed by providing a male screw thread on the securing ring 25, providing a female screw thread in the through-hole, and inserting and fastening the securing ring 25 into the through-hole. Additionally, as a material for the securing ring 25, aluminum or aluminum alloy, or nickel, nickel alloy, or further nickel-containing alloy a surface of which is nickel-coated can be used. An inside diameter of the securing ring 25 may be the same as that of the guide 23'. Additionally, an inside diameter of the securing ring 25 can be smaller than that of the guide 23' as described below.

Figure 5:
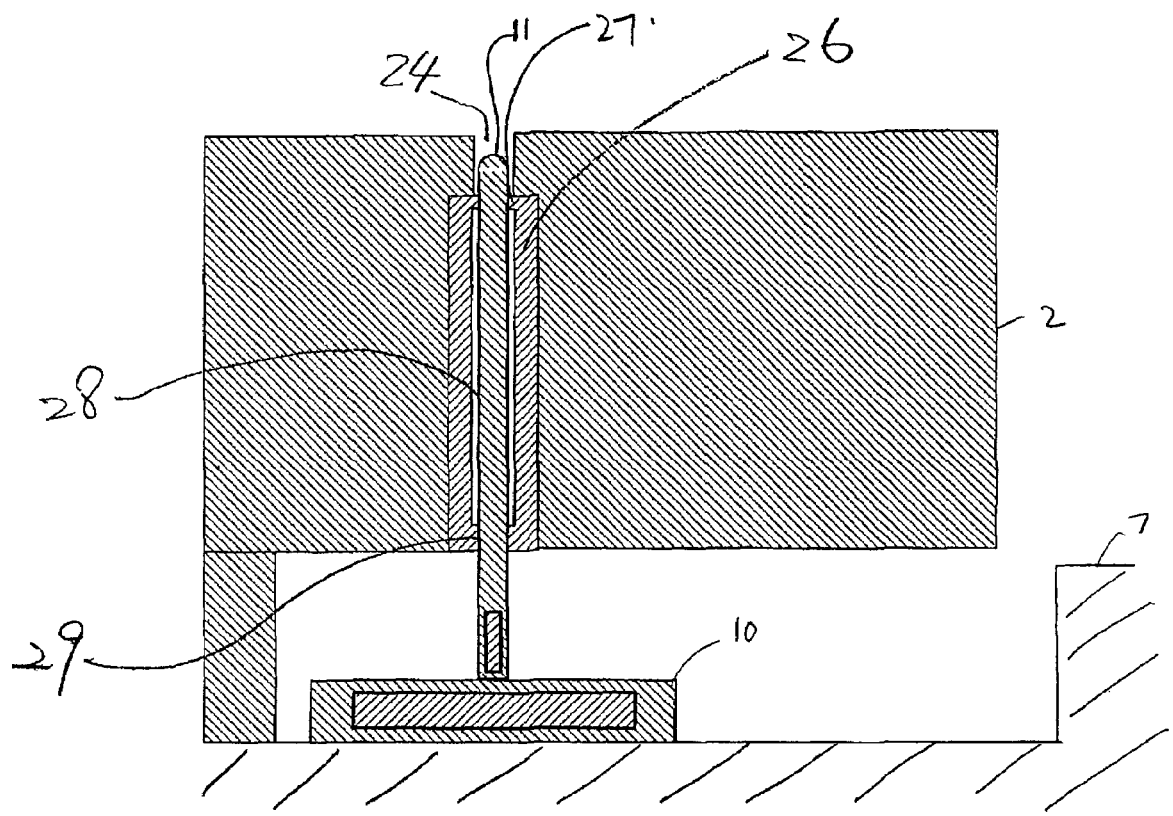
FIG. 5 is an enlarged schematic cross sectional view showing a structure of a lift pin area according to still another embodiment of the present invention.

Another embodiment is shown in FIG. 5.

A guide 26 inserted in a through-hole 24 in a susceptor 2 is a tubular structure. Its inside diameter differs at its lower and upper ends and at an intermediate portion; the intermediate portion has a relatively large diameter. Because of this diameter difference, a gap 28 is formed at the intermediate portion of the guide 26 between a wafer lift pin inserted 11 in the guide 26 and the guide 26. This gap reduces contact resistance produced between the guide 26 and the wafer lift pin 11 when the susceptor 2 is moved up and down.

This prevents a foreign matter from being generated by rubbing of the wafer lift pin 11 against the guide 26. A position of the wafer lift pin 11 is always coordinated to be at the center of the guide 26 by the narrow diameter of the upper end 27 and the lower end 29 of the guide 26. The position of the wafer lift pin 11 is also coordinated to be at the center of the through-hole 24 of the susceptor 2. As a result, occurrence of foreign matters generated by the tip of the wafer lift pin 11 coming in contact with a side wall of the through-hole 24 is prevented.

Furthermore, the surface of the wafer lift pin 11 is polish-finished with the surface roughness Ra of approximately 0.8 µm or less, preferably approximately 0.4 µm or less, to further reduce contact resistance with the guide 26. Additionally, the surface roughness Ra of respective inner surfaces of the guide 23, the guide 23' and the guide 26 which can come into contact with an outer surface of the lift pin may also be the same as the above, approximately 0.8 µm or less, preferably approximately 0.4 µm or less.

A gap between the wafer lift pin 11 and an upper end portion 27 and a lower end portion 29 of the guide 26 is approximately 0.5 mm to approximately 0.1 mm, preferably approximately 0.25 mm to approximately 0.15 mm (It may also be the same for FIGS. 3 and 4). A gap between the wafer lift pin 11 and an intermediate portion of the guide 26 may be approximately 0.2 mm or more, preferably approximately 0.4 mm or more than the gap with the upper end portion 27 and the lower end portion 29. A corner portion of the lower end portion 29 is radius-processed (R=0.2 mm or more; preferably R=0.5 mm or more). Inner surfaces of the lower end 29 and the upper end 27 of the guide 26, which are contact areas with the wafer lift pin 11, is polish-finished with the surface roughness Ra of approximately 0.8 µm or less, preferably approximately 0.4 µm or less.

Figure 6:
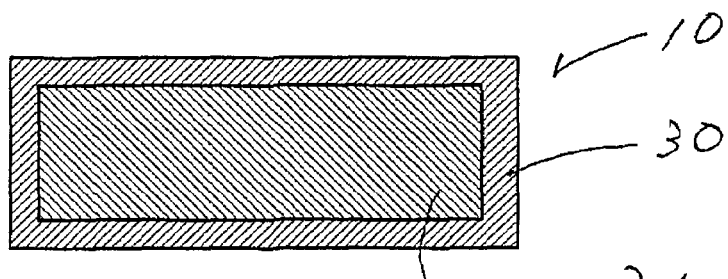
FIG. 6 is a schematic cross sectional view of a base member according to an embodiment of the present invention.

An example of a supporting member is shown in FIG. 6.

A supporting member 10 may have any of the following shapes, disk-shaped, cubic, etc. as long as it can be installed at a bottom portion of a reaction chamber 7. The supporting member 10 is fixed at the reaction chamber 7 by fitting it into a receiving structure (a concave portion; not shown) provided in the bottom plate 9 shown in FIG. 1.

A supporting member surface layer 30 is made of a material which can endure its ambient temperature, an atmosphere of oxygen active species or fluoride active species, plasma atmosphere, which can be selected from alumina ceramics, AlN, MgO, MgF or Y2O3. A carbon-containing material can be used in an environment in which an oxidative component does not exist or a small number of oxidative components exist. When an ambient temperature is below 200° C., a fluorine-containing resin can also be used. A material used for a magnet 31 embedded in the supporting member 10 is selected from a material, magnetic-flux density of which does not decline by an ambient temperature; for example, alnico magnet can be used at an ambient temperature up to 550° C. When a ceramic material is used for the supporting member surface layer 30, it is formed on a surface of the magnet 31 by spraying, thermal spraying, sputtering, etc. When a supporting member surface layer 30 is made of a resin-containing material, it is formed on a surface of the magnet 31 by spraying, coating, molding, etc.

Figure 7:
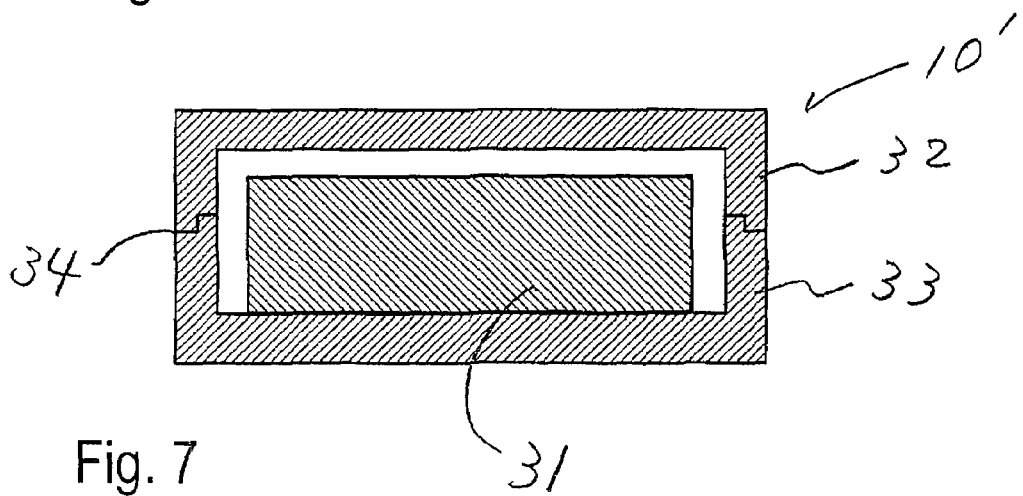
FIG. 7 is a schematic cross sectional view of a base member according to another embodiment of the present invention.

Still another embodiment is shown in FIG. 7.

In a supporting member 10', a magnet 31 is put in a box comprising box members 32, 33 made of a material which can endure its ambient temperature, an atmosphere of oxygen active species or fluoride active species, plasma atmosphere. It is not necessary to fix the magnet 31 inside the box members 32, 33. The box is formed by joining the box member 32 and the box member 33 together to prevent ambient atmosphere from going into the box. Because active species excited by plasma cannot pass through a joint 34 of the box members 32, 33 in their activated state, it is not necessary to completely seal the joint 34. It is necessary, however, to replace the magnet 31 because it is altered by penetrated corrosive gas and its magnetic-flux density is weakened over time in a high-temperature environment.

Figure 8:
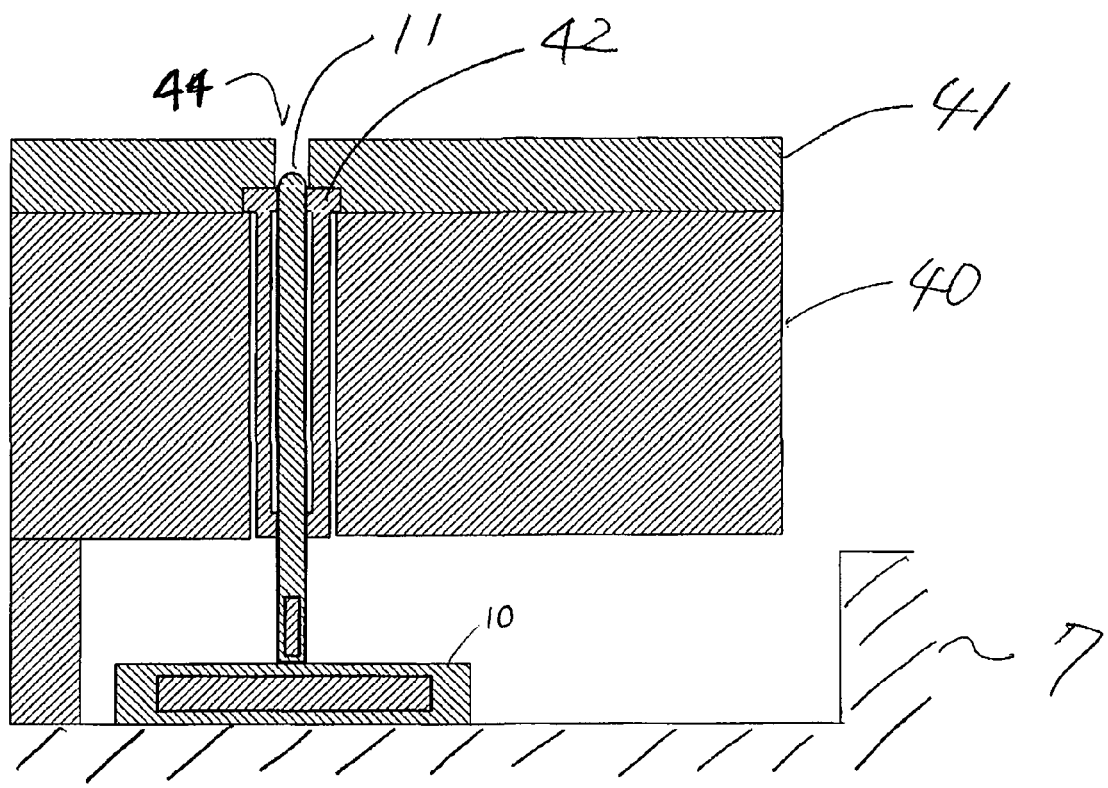
FIG. 8 is an enlarged schematic cross sectional view showing a structure of a lift pin area according to an embodiment of the present invention, wherein the lift pin is retracted from a top surface of a susceptor.

Yet another embodiment is shown in FIG. 8.

Figure 9:
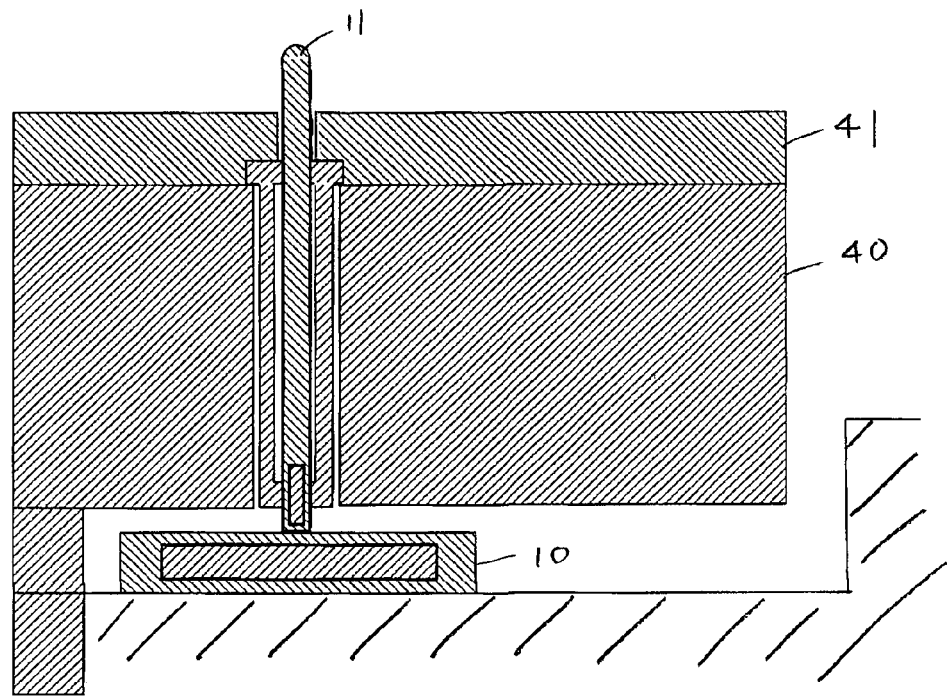
FIG. 9 is an enlarged schematic cross sectional view showing the structure of the lift pin area of FIG. 8, wherein the lift pin protrudes from the top surface of a susceptor as the susceptor moves downward.

A susceptor plate 41 for placing a semiconductor wafer (not shown) thereon is installed on an upper surface of a susceptor heater 40 in which a heating member (not shown) is embedded. Making the susceptor plate 41 being closely in contact with the susceptor heater 40 is achieved by a bolt (not shown). A guide 42 disposed in the periphery of a wafer lift pint 11 has a flange-shaped structure on its upper portion; the guide 42 is fixed in the susceptor plate 41 and the susceptor heater 40 by fitting this flange-shaped structure into a concave portion provided on the backside of the susceptor plate 41. The wafer lift pin 11 is inserted into the guide 42 and adsorbed in a downward direction by magnetic force of the supporting member 10 installed at a bottom portion of a reaction chamber 7. When a deposition process is performed to a semiconductor wafer (not shown), the susceptor heater 40 and the susceptor plate 41 are in their highest position in order to closely attached the semiconductor wafer (not shown) to an upper surface of the susceptor plate 41; and the wafer lift pin 11 is kept in a through-hole 44 of the susceptor plate 41 and the susceptor heater 40 including its tip. A case in which the susceptor plate 41 and the susceptor heater 40 are sent down is shown in FIG. 9. A tip of the wafer lift pin 11 protrudes from an upper surface of the susceptor plate 41.

An upper end of the wafer lift pin 11 is configured to support the backside of a semiconductor wafer 11 and its tip is shaped into a sphere, a cone, or a sphere or a cone with a flat tip.

Additionally, in order to prevent deterioration, fluorination or oxidation of the wafer lift pin by active species and plasma discharge inside a reaction chamber, the wafer lift pin is made of alumina ceramics, preferably alumina ceramics with its surface polished; further preferably alumina ceramics having purity of 99.9% or more and with its surface polished; further preferably high-purity alumina ceramics with its magnesium content limited to 500 ppm or less; further preferably alumina ceramics having an average particle size of 20 micron diameter or more and purity of 99.9% or more and with its surface polished.

Additionally, the structures of the lift pin and the guide shown in FIGS. 3, 4 and 5 can apply to a structure other than those in which a lower end of the lift pin is attached on a bottom portion of the reaction chamber by magnetic force.

For example, they can apply to a structure in which a lift pin is suspended in a through-hole of a susceptor. Additionally, in that case, it is not necessary to attach a magnet or a magnetic material in the vicinity of a lower end of the lift pin.

Figure 10:
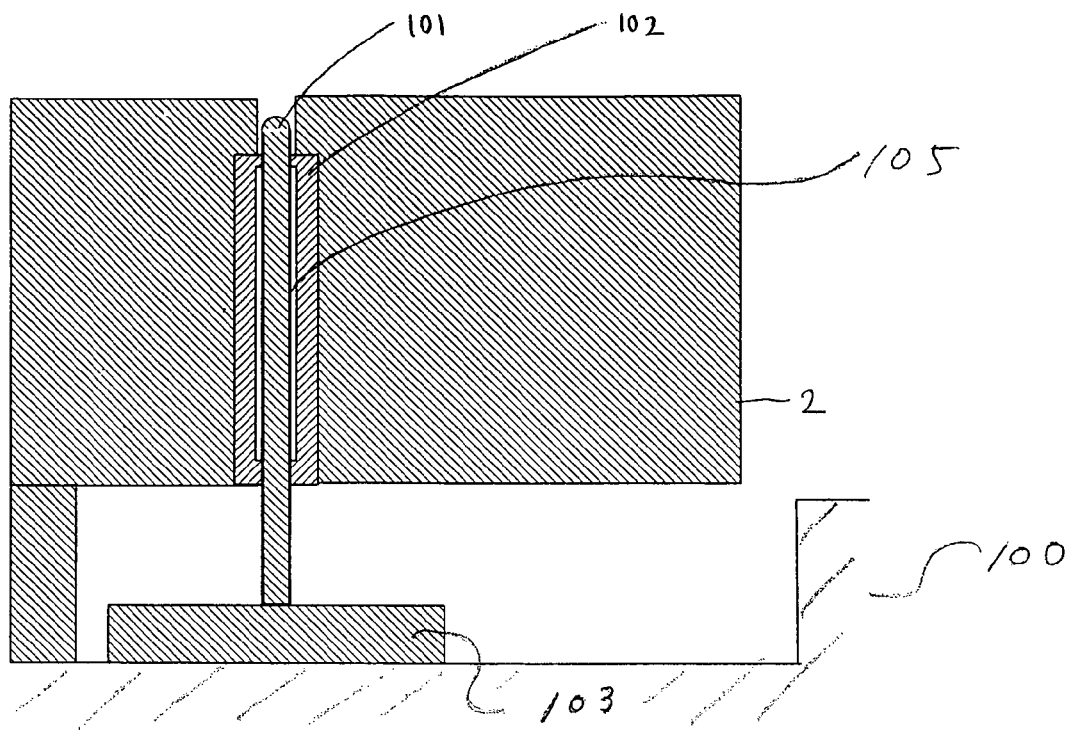
FIG. 10 is an enlarged schematic cross sectional view showing a structure of a lift pin area according to another embodiment of the present invention.

Additionally, a lower end of a lift pin may be configured not to be attached without using a magnet or a magnetic material. An apparatus shown in FIG. 10 is an aspect in which a lower end of the pin is not attached by magnetic force; other configuration can be the same as that shown in FIG. 5, but a surface of the pin is polish-finished in order to prevent the pin 101 from being caught in a guide 102 surrounding it; its surface roughness (Ra) may be approximately 0.8 μm or less, preferably approximately 0.4 μm or less. Additionally, an inner surface of the guide 102 is also polish-finished in the same manner as a surface of the pin 101. Furthermore, as a means for reducing contact resistance between the pin 101 and the guide 102, an internal intermediate portion of the guide 102 has a larger inside diameter. A lower end of the pin 101 is supported by an upper surface of a plate 103 installed at a bottom portion of a reaction chamber 100. Additionally, the plate 103 can be configured in the same manner as in the plate 10 shown in FIG. 5 except that a magnet is not embedded.

Figure 11:
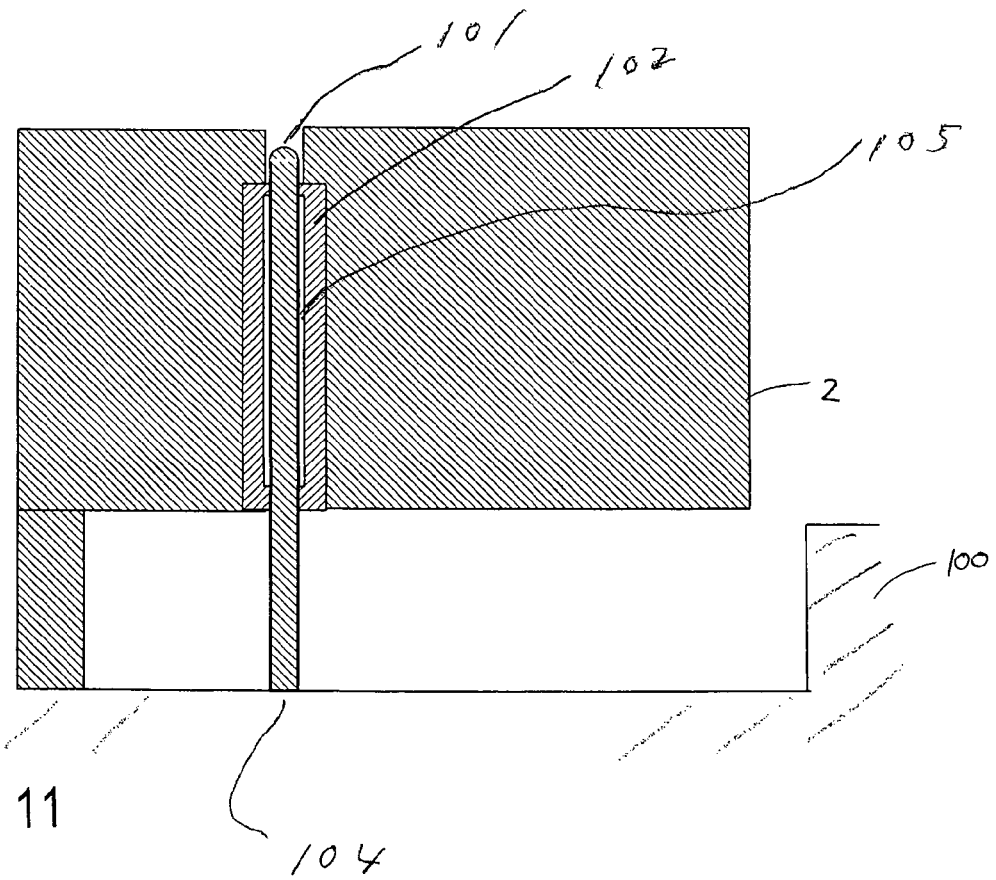
FIG. 11 is an enlarged schematic cross sectional view showing a structure of a lift pin area according to still another embodiment of the present invention.
Figure 12:
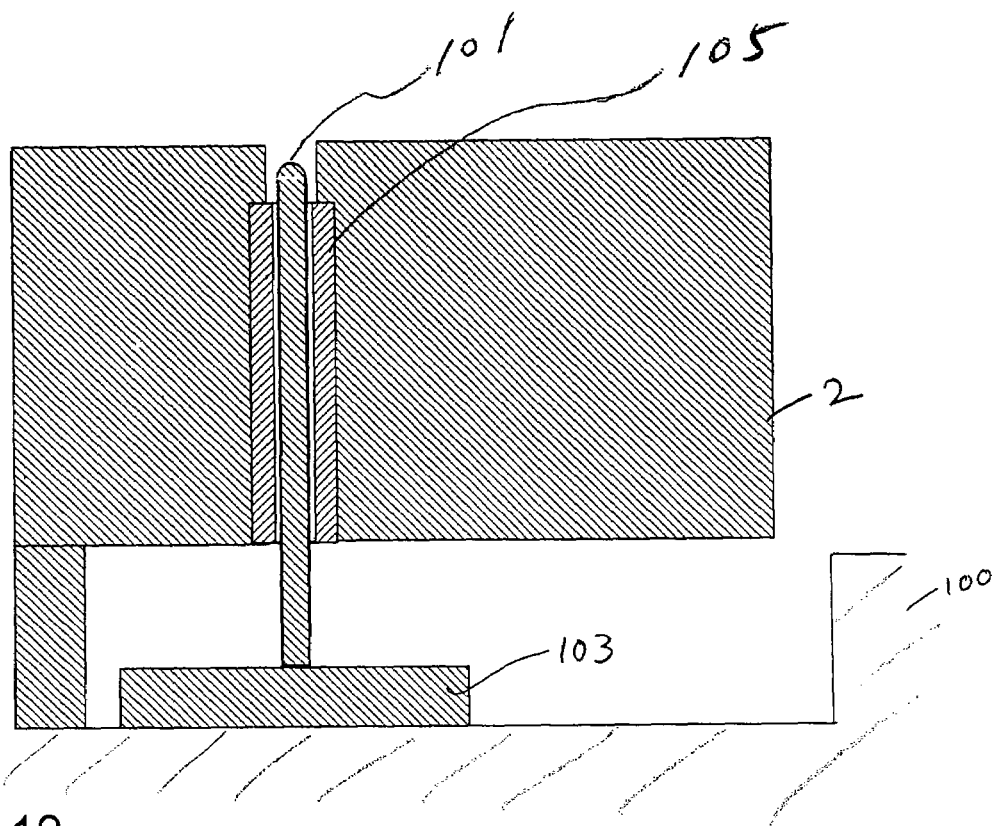
FIG. 12 is an enlarged schematic cross sectional view showing a structure of a lift pin area according to yet another embodiment of the present invention.
Figure 13:
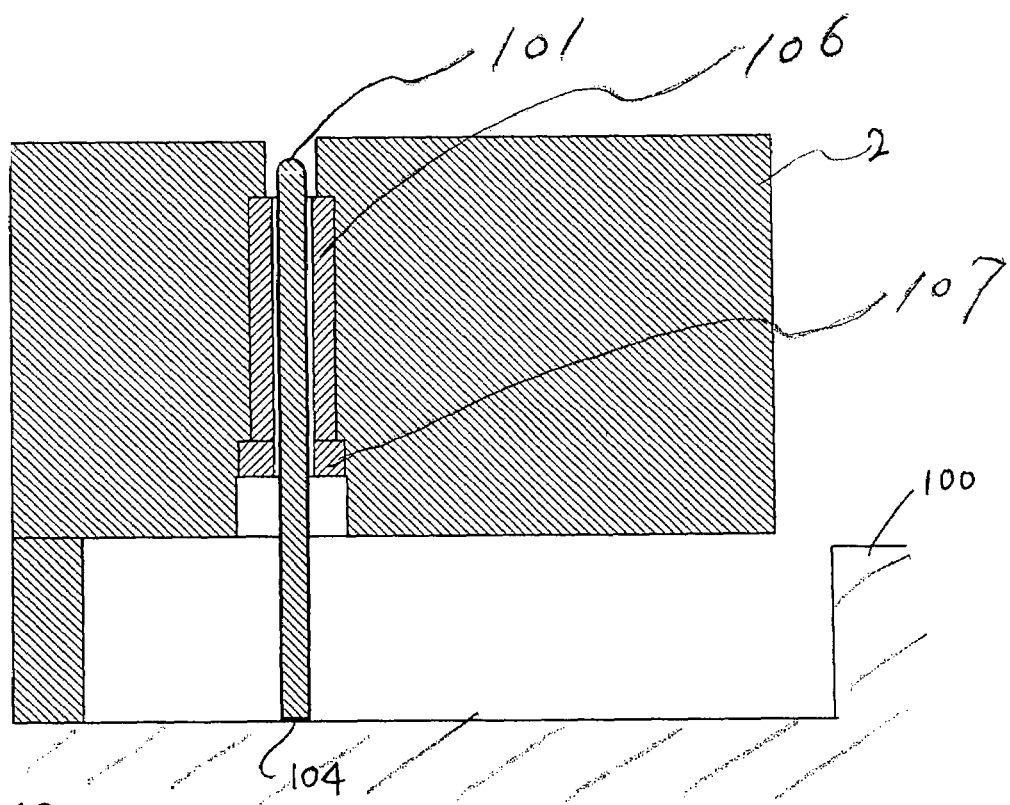
FIG. 13 is an enlarged schematic cross sectional view showing a structure of a lift pin area according to a further embodiment of the present invention.

Still another embodiment is shown in FIG. 11, in which a pin 101 is supported directly by a bottom portion 104 of a reaction chamber 100 without using a plate 103. Similarly to the embodiment shown in FIG. 10, in order to prevent the pin 101 from being caught by a guide 102 surrounding it, a surface of the pin 101 and an inner surface of the guide 102 are polish-finished and an internal space 105 is formed in the guide 102. In FIG. 12, as a means for reducing contact resistance between a pin 101 and the guide 105, the pin 101 with its surface polish-finished in the same manner as the aforesaid and the guide 105 with its inner surface polish-finished are shown. In FIG. 12, the guide 105 having a constant diameter is used in place of the guide 102; as a means for preventing the pin from being caught by the guide, an inner surface of the guide is polish-finished in the same manner as in FIG. 3. In FIG. 13, as a means for fixing a guide 106 inside a susceptor 2', a securing ring 107 similar to the securing ring 24 described in FIG. 4 is used.

As described above, according to at least one embodiment of the present invention described above, a lower end of the wafer pin is not attached on a bottom portion of the reaction chamber by a screw, etc. Furthermore, because the wafer lift pin is arranged always in the center position of the through-hole in the susceptor, appearance of foreign matters or damage to the wafer lift pin due to interference of the wafer lift pin with the through-hole at the time of a positional change of the through-hole in the susceptor caused by heat expansion, etc. is stopped.

Additionally, according to at least one embodiment of the present invention described above, because contact resistance produced between the wafer lift pin and the guide is reduced by polishing the periphery of the wafer lift pin, occurrence of the wafer lift pin getting caught by the guide is eliminated.

Additionally, according to at least one embodiment of the present invention described above, because a lower end of the wafer pin is adsorbed on the supporting member by magnetic force, a problem that the pin rises along with the an ascent of the susceptor because of the wafer pin being caught by the guide is also solved.

Furthermore, according to at least one embodiment of the present invention described above, because the wafer lift pin has a structure in which it is removably attached from an upper portion of the susceptor, a need for removing the susceptor is eliminated when only a wafer lift pin needs to be replaced; hence, shortening of work time and easiness of work are significantly improved.

Additionally, according to at least one embodiment of the present invention described above, even though the wafer lift pin is removably attached by using magnetic force as a means for fixing it, a stable wafer supporting mechanism in which the wafer lift pin is attached on a bottom portion of the reactor can be achieved in a practical aspect.

The present invention includes the above mentioned embodiments and other various embodiments including the following:

1) An apparatus performing semiconductor substrate processing, which is characterized by comprising a susceptor apparatus and a supporting mechanism, which support a semiconductor substrate inside a reaction chamber wherein the supporting mechanism is adsorbed on a bottom portion of the reaction chamber by magnetic force.

2) A method of fixing a supporting mechanism which supports a semiconductor substrate inside a reaction chamber, wherein the supporting mechanism is adsorbed on a bottom portion of the reaction chamber by magnetic force.

3) A semiconductor substrate processing apparatus, wherein the supporting mechanism is characterized by having a structure adsorbed on a bottom portion of a reaction chamber for reducing contact resistance with a guide provided in a susceptor apparatus.

4) A semiconductor substrate processing apparatus, wherein the structure for reducing contact resistance is characterized in that contact resistance reduction is achieved by reducing a contact area with a guide.

5) A semiconductor substrate processing apparatus, wherein the structure for reducing contact resistance is characterized in that a surface of a supporting mechanism is polished to have a surface roughness Ra of about 0.8 μm or less.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A semiconductor processing apparatus comprising:
   a reaction chamber;
   a susceptor disposed in the reaction chamber for placing a substrate thereon, said susceptor having through-holes in an axial direction of the susceptor;
   lift pins slidably disposed in the respective through-holes for lifting the substrate over the susceptor; said lift pins having lower ends which are attached to a bottom portion in the reaction chamber; and
   multiple pairs of magnetic elements, each pair being magnetically attracted to each other wherein one of the pair is provided at the lower end of each lift pin, and the other of the pair is provided at a base at the bottom portion in the reaction chamber, wherein the lift pins are magnetically attached to and in contact with the other of the pair and laterally movable relative to the bottom portion of the reaction chamber for reducing contact resistance between the lift pins and the respective through-holes.

2. The semiconductor processing apparatus according to claim 1, further comprising a drive which moves the susceptor in its axial direction.

3. The semiconductor processing apparatus according to claim 1, wherein the susceptor further comprises ceramic hollow columns inserted therein which form the respective through-holes.

4. The semiconductor processing apparatus according to claim 3, wherein each ceramic hollow column has an inner portion having an inner diameter which is smaller than that of the remaining inner portion which is not in contact with the lift pins.

5. The semiconductor processing apparatus according to claim 4, wherein the inner portion is arranged at upper and lower ends.

6. The semiconductor processing apparatus according to claim 3, wherein the susceptor is comprised of a susceptor plate and a susceptor heater, and an upper end of each ceramic hollow column has a flange which is affixed between the susceptor plate and the susceptor heater.

7. The semiconductor processing apparatus according to claim 6, wherein the lift pins have free lower ends and are suspended in the through-holes by supporting upper ends of the lift pins at an upper surface of the susceptor.

8. The semiconductor processing apparatus according to claim 3, wherein the ceramic hollow columns are substantially wholly embedded therein which form the respective through-holes.

9. The semiconductor processing apparatus according to claim 8, wherein each ceramic hollow column has an inner portion having an inner diameter which is smaller than that of the remaining inner portion which is not in contact with the lift pins.

10. The semiconductor processing apparatus according to claim 9, wherein the inner portion is arranged at upper and lower ends.

11. The semiconductor processing apparatus according to claim 9, wherein the inner portion has an inner surface having a surface roughness of about 0.8 µm or less.

12. The semiconductor processing apparatus according to claim 9, wherein each ceramic hollow column is substantially wholly embedded within the susceptor, and a gap between each lift pin and the inner diameter of the corresponding ceramic hollow column is about 0.5 mm to about 0.1 mm.

13. The semiconductor processing apparatus according to claim 1, wherein the susceptor further comprises ceramic hollow columns inserted therein which form the respective through-holes.

14. The semiconductor processing apparatus according to claim 1, wherein inner surfaces of the through-holes have a surface roughness of about 0.8µm or less.

15. The semiconductor processing apparatus according to claim 1, which is a plasma CVD/etching apparatus.

16. The semiconductor processing apparatus according to claim 1, wherein the other of the pair includes a magnet and a ceramic material or fluorine plastic cover.

17. The semiconductor processing apparatus according to claim 16, wherein the bottom portion of the reaction chamber is provided with a bottom plate made of ceramics on which the other of the pair is affixed.

18. The semiconductor processing apparatus according to claim 1, wherein the one of the pair contains a magnetic body embedded in the lower end of the lift pin.

19. The semiconductor processing apparatus according to claim 1, further comprising a drive which moves the susceptor in its axial direction.

20. The semiconductor processing apparatus according to claim 1, wherein the bottom portion of the reaction chamber is immovable relative to the reaction chamber.

* * * * *